(12) United States Patent
Hu

(10) Patent No.: US 12,417,952 B2
(45) Date of Patent: Sep. 16, 2025

(54) SEALING RING, STACKED STRUCTURE, AND METHOD FOR MANUFACTURING SEALING RING

(71) Applicant: CHANGXIN MEMORY TECHNOLOGIES, INC., Hefei (CN)

(72) Inventor: Hua Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 460 days.

(21) Appl. No.: 17/849,963

(22) Filed: Jun. 27, 2022

(65) Prior Publication Data

US 2023/0140743 A1     May 4, 2023

Related U.S. Application Data

(63) Continuation of application No. PCT/CN2022/071612, filed on Jan. 12, 2022.

(30) Foreign Application Priority Data

Oct. 29, 2021    (CN) .......................... 202111269355.7

(51) Int. Cl.
*H01L 23/10*     (2006.01)
*H01L 21/66*     (2006.01)
(Continued)

(52) U.S. Cl.
CPC .............. *H01L 23/10* (2013.01); *H01L 22/32* (2013.01); *H01L 23/3142* (2013.01); *H01L 24/08* (2013.01); *H01L 24/80* (2013.01); *H01L 25/0657* (2013.01); *H01L 2224/02185* (2013.01); *H01L 2224/08253* (2013.01); *H01L 2224/80007* (2013.01); *H01L 2224/80895* (2013.01); *H01L 2224/80896* (2013.01);
(Continued)

(58) Field of Classification Search
CPC ................... H01L 23/585; H01L 22/34; H01L 2224/08145; H01L 25/0657
See application file for complete search history.

(56) References Cited

U.S. PATENT DOCUMENTS 11,088,041 B2    8/2021   Chen et al.
2008/0191205 A1*   8/2008   Tsai .................. H01L 22/34
                                                         257/E23.001
(Continued)

FOREIGN PATENT DOCUMENTS

CN     205016497 U     2/2016
CN     109727926 A     5/2019
(Continued)

*Primary Examiner* — Kretelia Graham
*Assistant Examiner* — David J Goodwin
(74) *Attorney, Agent, or Firm* — SYNCODA LLC; Feng Ma

(57) ABSTRACT

Embodiments of the disclosure provide a sealing ring, a stacked structure, and a method for manufacturing a sealing ring. The sealing ring is arranged at a periphery of a device area of a chip, and includes an inner ring structure, a middle ring structure, and an outer ring structure. The middle ring structure is connected to the device area through a doped well. The doped well is located in part of a substrate corresponding to the inner ring structure and the middle ring structure, and is isolated from the inner ring structure.

16 Claims, 16 Drawing Sheets

(51) Int. Cl.
  H01L 23/00 (2006.01)
  H01L 23/31 (2006.01)
  H01L 25/065 (2023.01)
(52) U.S. Cl.
  CPC ............... *H01L 2225/06555* (2013.01); *H01L 2924/351* (2013.01)

(56) References Cited

U.S. PATENT DOCUMENTS

| | | | |
|---|---|---|---|
| 2010/0171203 A1* | 7/2010 | Chen | H01L 23/585 |
| | | | 257/773 |
| 2012/0326146 A1* | 12/2012 | Hui | H01L 22/32 |
| | | | 257/E29.325 |
| 2014/0361438 A1 | 12/2014 | Zeng et al. | |
| 2019/0131255 A1 | 5/2019 | Teng et al. | |
| 2021/0098392 A1 | 4/2021 | Wu et al. | |
| 2022/0310570 A1* | 9/2022 | Chang | H01L 21/568 |

FOREIGN PATENT DOCUMENTS

| CN | 112530930 A | 3/2021 |
|---|---|---|
| CN | 112599545 A | 4/2021 |

* cited by examiner

SEALING RING, STACKED STRUCTURE, AND METHOD FOR MANUFACTURING SEALING RING

CROSS-REFERENCE TO RELATED APPLICATION

This application is a U.S. continuation application of International Application No. PCT/CN2022/071612, filed on Jan. 12, 2022, which claims priority to Chinese Patent Application No. 202111269355.7, filed on Oct. 29, 2021. The disclosures of International Application No. PCT/CN2022/071612 and Chinese Patent Application No. 202111269355.7 are hereby incorporated by reference in their entireties.

TECHNICAL FIELD

The disclosure relates to the technical field of semiconductors, and relates to, but is not limited to, a sealing ring, a stacked structure, and a method for manufacturing a sealing ring.

BACKGROUND

A sealing ring is usually formed between a scribe line of each chip of a wafer and a surrounding area of an integrated circuit. When a wafer cutting process is performed along the scribe line, the sealing ring may prevent the stress from the scribe line to the integrated circuit caused by the above wafer cutting process. In addition, the sealing ring may further prevent foreign particles and moisture from damaging devices inside the chip.

In related art, the sealing ring is designed as a double-layer structure to resist more serious damage to the chip. However, the resistance performance of the sealing ring with the double-layer structure is still limited, and related technologies cannot realize the detection of the integrity of the sealing ring.

SUMMARY

In view of this, embodiments of the disclosure provide a sealing ring, a stacked structure, and a method for manufacturing a sealing ring.

In a first aspect, an embodiment of the disclosure provides a sealing ring. The sealing ring is arranged at a periphery of a device area of a chip, and includes an inner ring structure, a middle ring structure, and an outer ring structure.

The middle ring structure is connected to the device area through a doped well. The doped well is located in part of a substrate corresponding to the inner ring structure and the middle ring structure, and is isolated from the inner ring structure.

In a second aspect, an embodiment of the disclosure provides a stacked structure. The stacked structure includes a plurality of chips that are bonded back-to-face in sequence, and each chip includes at least the above sealing ring.

In a third aspect, an embodiment of the disclosure provides a method for manufacturing a sealing ring. The sealing ring is arranged at a periphery of a device area of a chip. The method includes the following operations:

A doped well is formed in a substrate of the chip.

An inner ring structure, a middle ring structure, and an outer ring structure are formed around the device area on a surface of the substrate.

The sealing ring is formed by the inner ring structure, the middle ring structure, and the outer ring structure. The middle ring structure is connected to the device area through the doped well. The doped well is located in part of the substrate corresponding to the inner ring structure and the middle ring structure, and is isolated from the inner ring structure.

BRIEF DESCRIPTION OF THE DRAWINGS

In the drawings (which are not necessarily drawn to scale), similar drawing signs may describe similar parts in different views. Similar drawing signs with different letter suffixes may represent different examples of similar parts. The drawings generally illustrate the various embodiments discussed herein by way of examples rather than limitation.

DETAILED DESCRIPTION

Figure 1A:
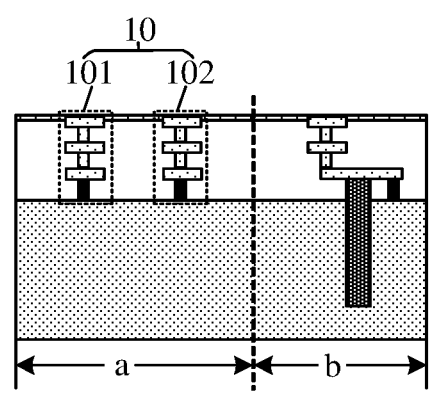
FIG. 1A schematically shows a structure of a sealing ring in the related art.

Exemplary implementations disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, not all the features of the actual embodiments are described here, and well-known functions and structures are not described in detail.

In the drawings, the sizes of a layer, an area, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms "first", "second", "third" and the like may be used to describe various elements, components, areas, layers and/or sections, these elements, components, areas, layers and/or sections should not be limited by these terms. These terms are only used to distinguish one element, component, area, layer or section from another element, component, area, layer or section. Therefore, without departing from the teaching of the disclosure, a first element, component, area, layer, or section discussed below may be represented as a second element, component, area, layer, or section. While the second element, component, area, layer, or section is discussed, it does not mean that the first element, component, area, layer, or section is necessarily existent in the disclosure.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "consisting" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

Currently, the periphery of a chip is provided with a sealing ring area configured to form a sealing ring structure. The sealing ring structure extends to a top metal from a surface of the substrate, to enhance the strength of the chip, so that devices inside the chip can be protected from being damaged by external stress and foreign particles or moisture.

Before describing in details a sealing ring provided in an embodiment of the disclosure, the sealing ring in the related art is first introduced.

Figure 1B:
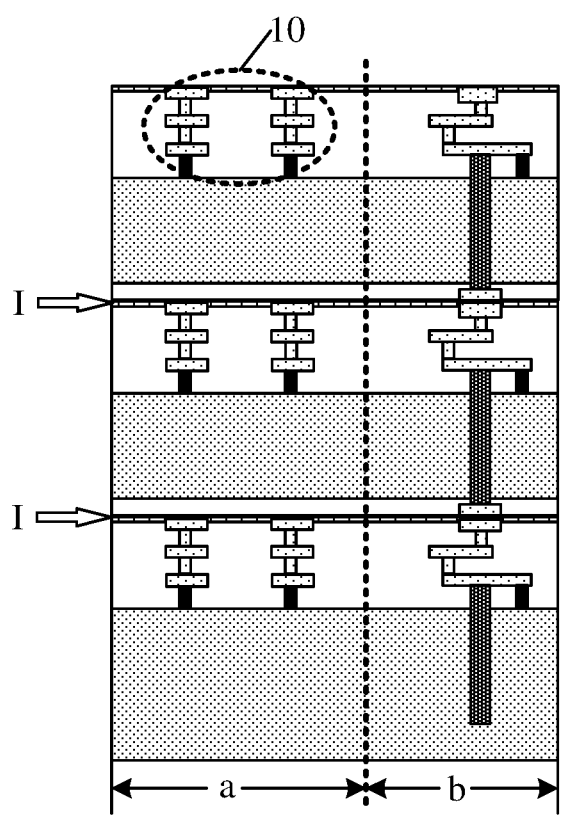
FIG. 1B schematically shows a structure of stacked chips in the related art.

FIG. 1A schematically shows a structure of a sealing ring in the related art. As shown in FIG. 1A, the sealing ring 10 in the related art includes a first sealing ring structure 101 and a second sealing ring structure 102 that are located in a sealing ring area a. In this way, through a double-layer structure of the first sealing ring structure 101 and the second sealing ring structure 102, a device area b is protected from being damaged by the external stress and the foreign particles or the moisture. FIG. 1B schematically shows a structure of stacked chips in the related art. As shown in FIG. 1B, the sealing ring 10 in the related art is only located on one side of a chip. For back-to-face bonded stacked chips, due to the lack of the sealing ring on the other side of the chip and the impact of a bonding process, a bonding interface I between the chips becomes a weak link that affects the reliability of the chips. In addition, the integrity of the sealing ring cannot be detected by related technologies.

Based on problems in the related art, the embodiments of the disclosure provide a sealing ring, a stacked structure, and a method for manufacturing a sealing ring. In this disclosure, the sealing ring includes the inner ring structure, the middle ring structure, and the outer ring structure. The middle ring structure is connected to the device area through the doped well. The doped well is located in part of the substrate corresponding to the inner ring structure and the middle ring structure, and is isolated from the inner ring structure. Since the sealing ring includes the middle ring structure, chip strength may be further enhanced, so that the reliability for protecting the devices inside the chip may be achieved. In addition, since the middle ring structure can be connected to the device area through the doped well, the integrity of the sealing ring may be detected by designing a specific functional circuit at the device area.

Figure 2:
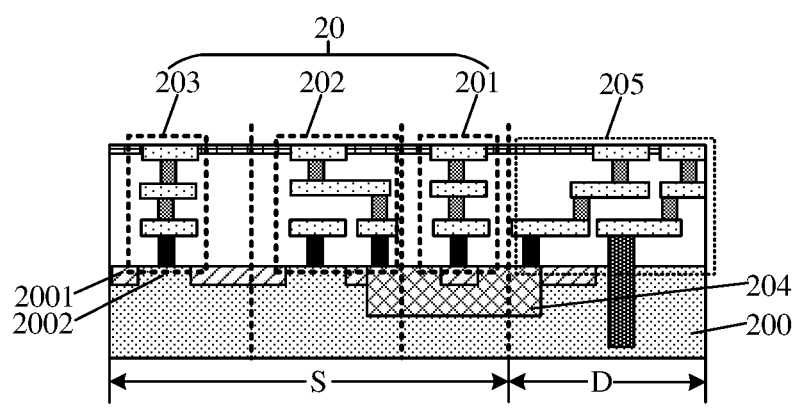
FIG. 2 schematically shows a structure of a sealing ring according to an embodiment of the disclosure.

An embodiment of the disclosure provides a sealing ring. FIG. 2 schematically shows a structure of a sealing ring according to an embodiment of the disclosure. As shown in FIG. 2, the sealing ring 20 includes an inner ring structure 201, a middle ring structure 202, and an outer ring structure 203.

In this embodiment of the disclosure, the sealing ring is arranged in a sealing ring area S at a periphery of a device area D of a chip. The middle ring structure 202 is connected to the device area D of the chip through a doped well 204. The doped well 204 is located in part of a substrate 200 corresponding to the inner ring structure 201 and the middle ring structure 202, and is isolated from the inner ring structure 201.

In this embodiment of the disclosure, the substrate of the chip may be a silicon substrate. The substrate of the chip may also include other semiconductor elements, such as Germanium (Ge), or include semiconductor compounds, such as Silicon Carbide (SiC), Gallium Arsenide (GaAs), Gallium Phosphide (GaP), Indium Phosphide (InP), Indium Arsenide (InAs), or Indium Antimonide (InSb), or include other semiconductor alloys, such as Silicon Germanium (SiGe), Gallium Arsenide Phosphide (GaAsP), Indium Aluminum Arsenide (AlInAs), Gallium Aluminum Arsenide (AlGaAs), Indium Gallium Arsenide (GaInAs), Indium Gallium Phosphide (GaInP), and/or Phosphorous Gallium Indium Arsenide (GaInAsP) or a combination thereof.

In this embodiment of the disclosure, the substrate 200 is further provided with a plurality of isolation areas 2001 and active areas 2002 that are arranged at intervals. The inner ring structure 201 is isolated from the doped well 204 by the isolation area 2001.

In some embodiments, the device area D is provided with a test circuit 205. The middle ring structure 202 is connected to the test circuit 205 through the doped well 204, to test the integrity of the middle ring structure 202 by using the test circuit 205.

It is to be noted that, in this embodiment of the disclosure, the inner ring structure and the outer ring structure may include a plurality of sub sealing ring structures. The number of sub-rings of the inner ring structure and the outer ring structure is not limited herein.

Since the sealing ring provided in this embodiment of the disclosure includes the middle ring structure, chip strength may be further enhanced, so that the reliability for protecting the devices inside the chip may be achieved. In addition, since the middle ring structure can be connected to the device area through the doped well, the integrity of the sealing ring may be detected by designing a specific test circuit at the device area.

Figure 3A:
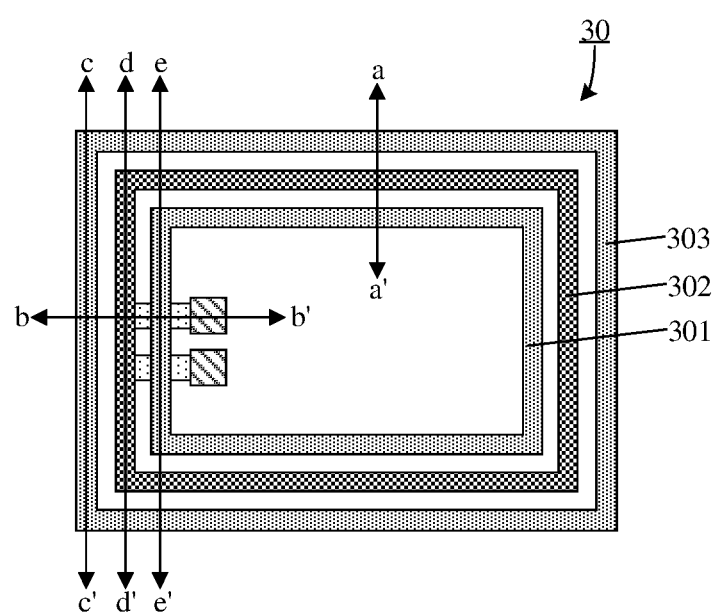
FIG. 3A shows a top view of a sealing ring according to an embodiment of the disclosure.

FIG. 3A shows a top view of a sealing ring according to an embodiment of the disclosure. FIGS. 3B to 3F show cross-sectional views of the sealing ring in FIG. 3A in different directions according to an embodiment of the disclosure. Referring to FIGS. 3A to 3F, it can be seen that, in the embodiments of the disclosure, the sealing ring 30 includes an inner ring structure 301, a middle ring structure 302, and an outer ring structure 303. The middle ring structure 302 includes a first middle ring structure 3021 and a second middle ring structure 3022. The first middle ring structure 3021 is arranged in a first dielectric layer 306 of a first surface A of a substrate 300. The second middle ring structure 3022 is arranged in a second dielectric layer 307 of a second surface B of the substrate 300. The first surface A and the second surface B are two surfaces that are arranged opposite to each other in a thickness direction of the substrate.

In the embodiments of the disclosure, the middle ring structure 302 is connected to the test circuit 305 in the device area D through the doped well 304, to test the integrity of the middle ring structure by using the test circuit 305. The doped well 304 crosses the inner ring structure and the middle ring structure, and is isolated from the inner ring structure.

Figure 3B:
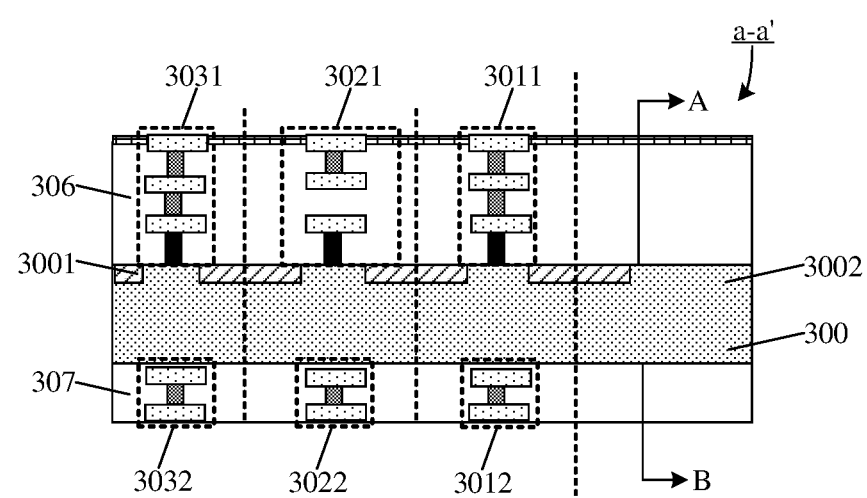
FIGS. 3B to 3F show cross-sectional views of the sealing ring in FIG. 3A in different directions according to an embodiment of the disclosure.
Figure 3C:
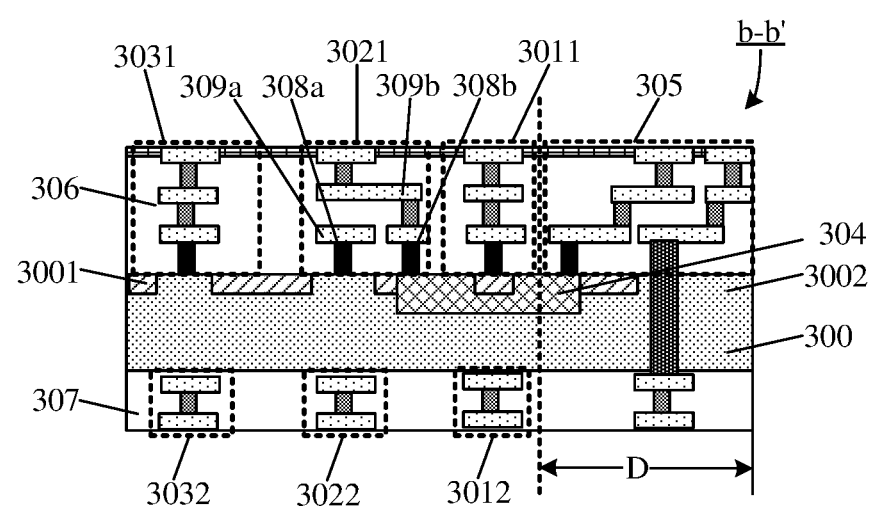
Figure 3D:
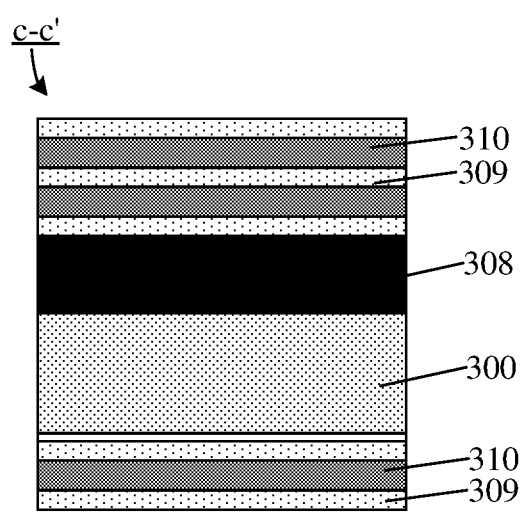
Figure 3E:
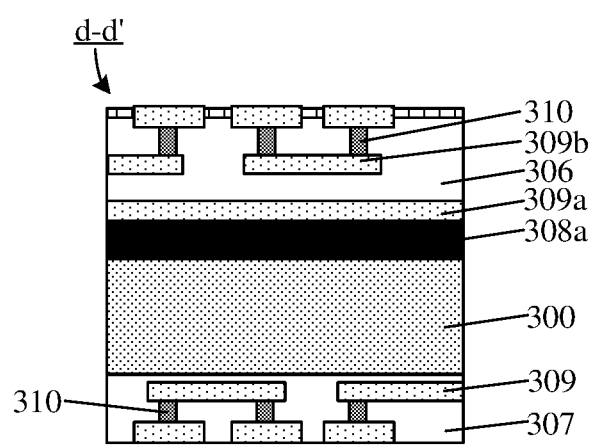
Figure 3F:
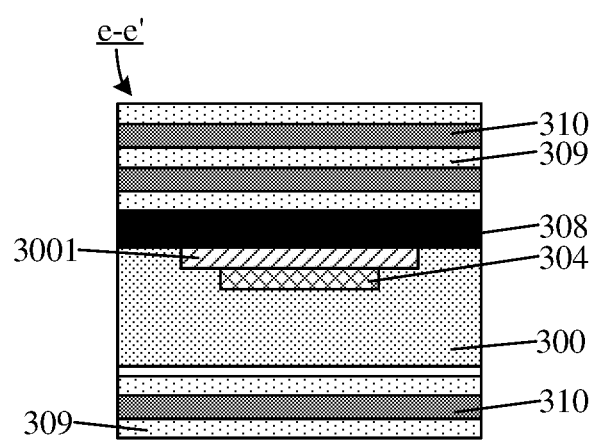

Continuously referring to FIGS. 3B, 3C, and 3E, the first middle ring structure 3021 includes a plurality of metal layers (only three metal layers being shown in the figure), a via 310 connecting the metal layer, and a metal plug connecting the substrate 300 and the metal layer. The second middle ring structure 3022 includes at least two metal layers 309 (only two metal layers being shown in the figure) and the via 310 connecting the adjacent metal layers.

In the embodiments of the disclosure, the metal layers may be composed of any metal, such as copper or tungsten. The via may also be filed with any metal material, such as copper. The metal plug may be a tungsten plug.

Continuously referring to FIGS. 3B, 3C, and 3E, the doped well 304 is located in the first surface A of the substrate 300. The first surface A of the substrate 300 further includes a plurality of isolation areas 3001 and active areas 3002 that are arranged at intervals. The metal plug of the first middle ring structure 3021 includes a first metal plug 308a and a second metal plug 308b. The first metal plug 308a is configured to connect the active area 3002 and the first metal layer 309a of the plurality of metal layers. The second metal plug 308b is configured to connect the doped well 304 and the second metal layer 309b of the plurality of metal layers.

In the embodiments of the disclosure, the first metal layer may be a bottom metal layer of the plurality of metal layers. The second metal layer may be a sub-bottom metal layer of the plurality of metal layers or a bottom metal layer different from the first metal layer.

The first metal layer 309a of the first middle ring structure 3021 is not connected to the second metal layer 309b of the first middle ring structure 3021.

Continuously referring to FIGS. 3B to 3F, the inner ring structure 301 includes a first inner ring structure 3011 arranged in the first dielectric layer 306 and a second inner ring structure 3012 arranged in the second dielectric layer 307. The outer ring structure 303 includes a first outer ring structure 3031 arranged in the first dielectric layer 306 and a second outer ring structure 3032 arranged in the second dielectric layer 307.

In some embodiments, the inner ring structure and the outer ring structure of the sealing ring are identical. That is to say, the first inner ring structure 3011 has a same structure as the first outer ring structure 3031, and the second inner ring structure 3012 has a same structure as the second outer ring structure 3032. In the embodiments of the disclosure, the second middle ring structure 3022 also has a same structure as the second inner ring structure 3012.

Continuously referring to FIGS. 3B, 3C, 3D and 3F, the first inner ring structure 3011 and the first outer ring structure 3031 both include the plurality of metal layers 309, the vias connecting the metal layers, and metal plugs connecting the substrate 300 and the third metal layer of the plurality of metal layers. The third metal layer may be a bottom metal layer of the plurality of metal layers. The second inner ring structure 3012 and the second outer ring structure 3032 both include at least two metal layers 309 (only two metal layers being shown in the figure) and the vias 310 connecting the adjacent metal layers. In the embodiments of the disclosure, the metal plug 310 of the first inner ring structure 3011 is arranged at the isolation area 3001, and the metal plug 310 of the first outer ring structure 3031 is arranged at the active area 3002.

In the embodiments of the disclosure, the metal plug of the first inner ring structure is arranged at the isolation area. In this way, the extraction of the first middle ring structure does not damage the integrity of the metal plug of the inner ring structure. In addition, in the sealing ring provided in the embodiments of the disclosure, the inner ring is close to the device area, and the outer ring is away from the device area. Therefore, by arranging the middle ring structure having a complex structure between the inner ring structure and the outer ring structure, the sealing performance of the sealing ring is enhanced without damaging the inner ring structure and the outer ring structure.

In some embodiments, the sealing ring is arranged in a stacked structure. The stacked structure includes at least a first chip and a second chip that are stacked in sequence. The first middle ring structure of the second chip is electrically connected to the test circuit through the doped well.

In some embodiments, the second middle ring structure of the first chip is connected to the first middle ring structure of the second chip. The first middle ring structure of the second chip is electrically connected to the test circuit through the doped well. The device area of each chip in the stacked structure is further provided with a silicon via. The test circuit is connected to a surface of a topmost chip in the stacked structure through the silicon via.

Figure 4:
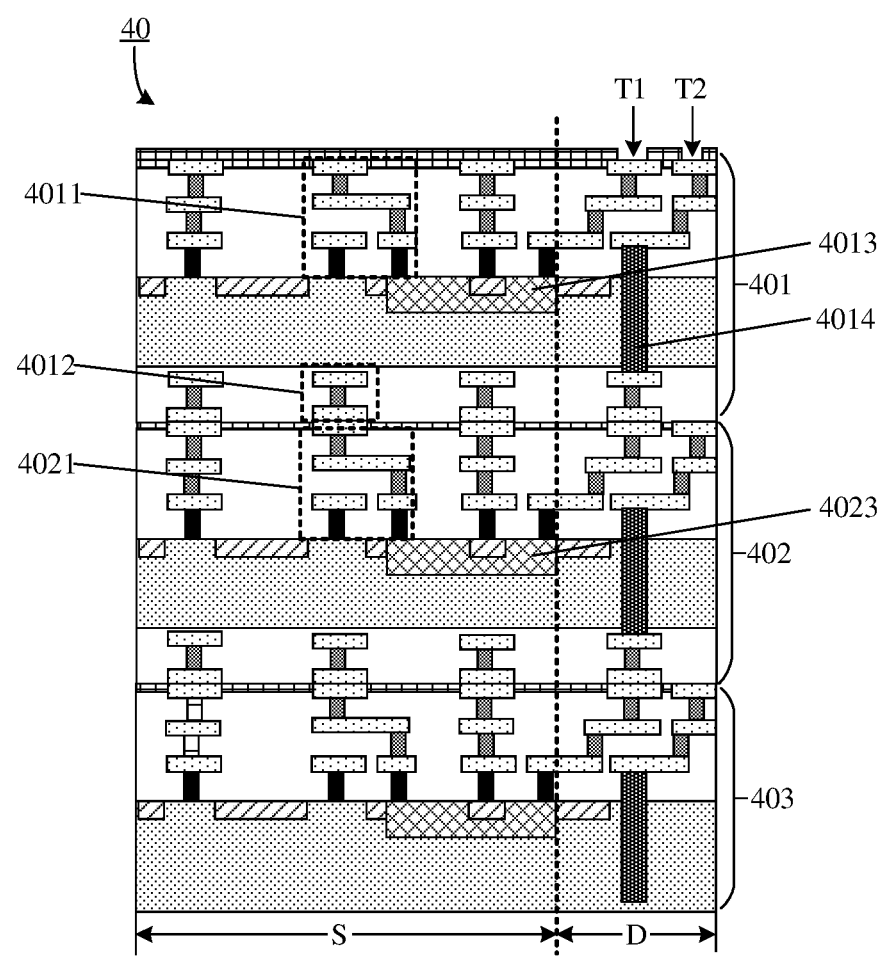
FIG. 4 schematically shows a structure of a stacked structure according to an embodiment of the disclosure.

An embodiment of the disclosure provides a stacked structure. The stacked structure includes a plurality of chips that are bonded back-to-face in sequence, and each chip includes at least the sealing ring in the above embodiments. FIG. 4 schematically shows a structure a stacked structure according to an embodiment of the disclosure. As shown in FIG. 4, the stacked structure 40 includes three chips bonded back-to-face in sequence, i.e., a chip 401, a chip 402, and a chip 403. The first middle ring structure 4011 of the chip 401 is connected to the test circuit in the device area D through the doped well 4013 of the chip 401, to detect the structural integrity of the first middle ring structure 4011 by using a test point T1 at a top of the test circuit. The first middle ring structure 4021 of the chip 402 is connected to the second middle ring structure 4012 of the chip 401. The first middle ring structure 4021 of the chip 402 is connected to the test circuit of the chip 402 through the doped well 4023 of the chip 402. The test circuit of the chip 402 is connected to the surface of the topmost chip (i.e., the chip 401) in the stacked structure 40 through the silicon via 4014 of the chip 401, to detect whether a bonding interface between the chip 402 and the chip 401 fails by using a test point T2. In this embodiment of the disclosure, the test point on the surface of the topmost chip (i.e., the chip 401) and the number of the test points are not limited.

It is to be noted that, in other embodiments, the stacked structure may include a 2, 4, or 6 chips. In this embodiment of the disclosure, the number of the chips in the stacked structure is not limited.

According to the sealing ring structure provided in this embodiment of the disclosure, it can prevent bonding failure caused by stress action during the cutting and packaging of the chips, while the structural integrity of the chips may be detected, and a failure layer of the stacked chips may be positioned.

Figure 5:
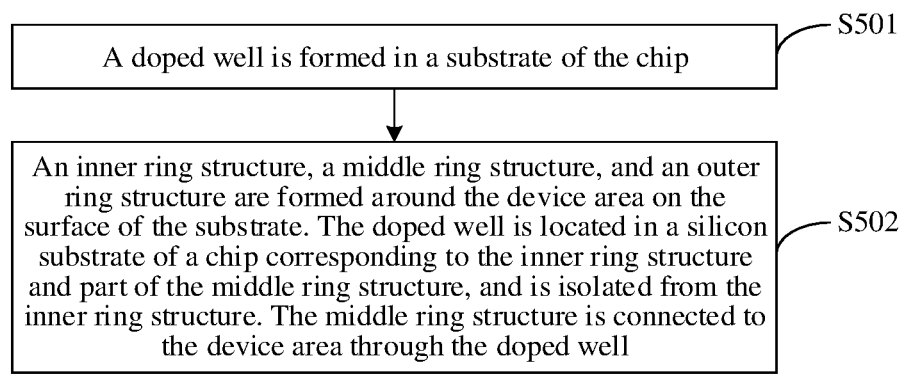
FIG. 5 schematically shows a flowchart of a method for manufacturing a sealing ring according to an embodiment of the disclosure.

In addition, an embodiment of the disclosure further provides a method for manufacturing a sealing ring. The sealing ring is arranged at a periphery of a device area of a chip. FIG. 5 schematically shows a flowchart of a method for manufacturing a sealing ring according to an embodiment of the disclosure. FIGS. 6A to 6E schematically show structures during the formation of a sealing ring according to an embodiment of the disclosure. As shown in FIG. 5, the method for manufacturing a sealing ring includes the following operations.

At S501, a doped well is formed in a substrate of the chip.

In the embodiments of the disclosure, N-type ion or P-type ion doping may be performed on the substrate to form the doped well. The doped well is formed in a first surface of the substrate. The first surface may be any surface in a thickness direction of the substrate.

In this embodiment of the disclosure, the substrate of the chip may be a silicon substrate. The substrate of the chip may also include other semiconductor elements, such as Germanium (Ge), or include semiconductor compounds, such as Silicon Carbide (SiC), Gallium Arsenide (GaAs), Gallium Phosphide (GaP), Indium Phosphide (InP), Indium Arsenide (InAs), or Indium Antimonide (InSb), or include other semiconductor alloys, such as Silicon Germanium (SiGe), Gallium Arsenide Phosphide (GaAsP), Indium Aluminum Arsenide (AlInAs), Gallium Aluminum Arsenide (AlGaAs), Indium Gallium Arsenide (GaInAs), Indium Gallium Phosphide (GaInP), and/or Phosphorous Gallium Indium Arsenide (GaInAsP) or a combination thereof.

In some embodiments, the method for manufacturing a sealing ring further includes the following operations.

At S10, a plurality of isolation areas and active areas that are arranged at intervals are formed in the first surface of the substrate.

In some embodiments, the first surface of the substrate is etched to form a plurality of etched grooves arranged at intervals, and then the etched grooves are filled with an insulation material to form the isolation areas.

Figure 6A:
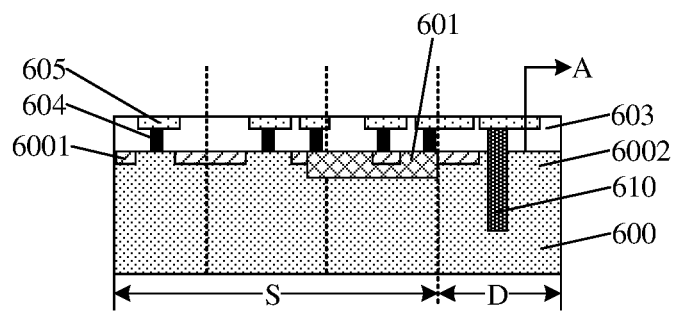
FIGS. 6A to 6E schematically show structures during the formation of a sealing ring according to an embodiment of the disclosure.

As shown in FIG. 6A, the doped well 601, the plurality of spaced isolation areas 6001 and the active areas 6002 that are arranged at intervals are formed in the first surface A of the substrate 600.

In the embodiments of the disclosure, the doped well 601 is isolated from the inner ring structure through the isolation areas 6001.

It is to be noted that, in the embodiments of the disclosure, there is no strict sequence relationship during the formation of the isolation areas and the doped well. The isolation areas may first be formed, and then the doped well is formed. Alternatively, the doped well may first be formed, and then the isolation areas are formed. There is an inversion layer between the doped well and the substrate, to achieve isolation from the substrate.

At S502, an inner ring structure, a middle ring structure, and an outer ring structure are formed around the device area on the surface of the substrate. The doped well is located in a silicon substrate of a chip corresponding to the inner ring structure and part of the middle ring structure, and is isolated from the inner ring structure. The middle ring structure is connected to the device area through the doped well.

In the embodiments of the disclosure, the sealing ring is formed by the inner ring structure, the middle ring structure, and the outer ring structure. The middle ring structure is connected to the device area through the doped well. The doped well is located in part of the substrate corresponding to the inner ring structure and the middle ring structure, and is isolated from the inner ring structure.

In some embodiments, S502 may include the following operations.

The inner ring structure, the middle ring structure, and the outer ring structure are respectively formed around the device area on a first surface of the substrate and a second surface of the substrate. The first surface is arranged opposite to the second surface.

In the embodiments of the disclosure, the inner ring structure includes at least a first inner ring structure located on the first surface of the substrate. The middle ring structure includes at least a first middle ring structure located on the first surface of the substrate. The outer ring structure includes at least a first outer ring structure located on the first surface of the substrate. The formation of the inner ring structure, the middle ring structure, and the outer ring structure in the first surface of the substrate includes the following operations.

At S5021, a first dielectric layer is formed on the first surface of the substrate.

Herein, the first dielectric layer may be a silicon oxide layer or other material layer. In the embodiments of the disclosure, the first dielectric layer may be formed through any suitable deposition process, such as Chemical Vapor Deposition (CVD), Physical Vapor Deposition (PVD), Atomic Layer Deposition (ALD), spin coating or coating.

Continuously referring to FIG. 6A, it can be seen that, the first dielectric layer 603 is formed on the first surface A of the substrate 600.

At S5022, the first inner ring structure, the first middle ring structure, and the first outer ring structure are formed in the first dielectric layer.

In some embodiments, S5022 may include the following operations.

The first dielectric layer is etched to form a plurality of first etching holes. The first etching holes of the first inner ring structure allow a surface of the isolation area to be exposed. The first etching holes of the first middle ring structure allow surfaces of the active area and the doped well to be exposed respectively. The first etching holes of the first outer ring structure allows the surface of the active area to be exposed respectively.

In the embodiments of the disclosure, the first dielectric layer may be etched through dry etching, for example, a plasma etching, reactive ion etching, or ion milling, to form the first etching holes.

A first metal material is filled in each first etching hole to form a metal plug.

The first metal material may be any metal material, such as tungsten or copper.

A plurality of metal layers and a via connecting the metal layers are formed on a surface of each metal plug.

Figure 6B:
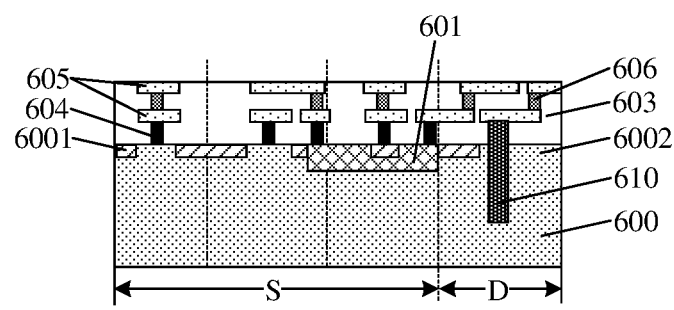
Figure 6C:
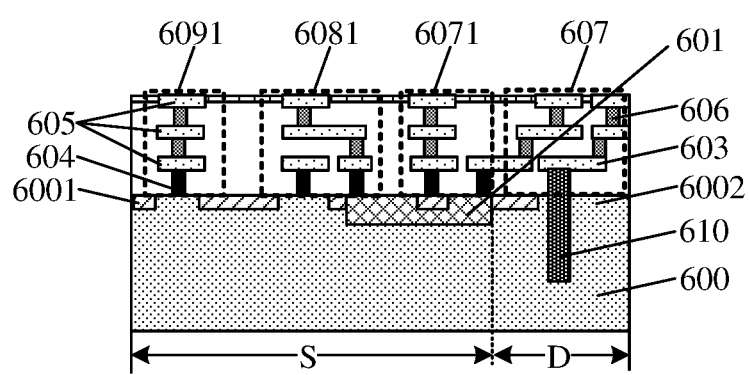

As shown in FIGS. 6A to 6C, three metal layers 605 and the via 606 connecting the two adjacent metal layers are formed on the surface of the metal plug 604, so that a first inner ring structure 6071, a first middle ring structure 6081, and a first outer ring structure 6091 are formed.

In some embodiments, continuously referring to FIGS. 6A to 6C, while the first inner ring structure 6071, the first middle ring structure 6081, and the first outer ring structure 6091 are formed, a test circuit 607 is formed in the first dielectric layer 603 on the surface of the device area D. The first middle ring structure 6081 is electrically connected to the test circuit 607 through the doped well 601. While the metal plug 604 is formed, a silicon blind via structure 610 located at the device area D is further formed.

It is to be noted that, in the embodiments of the disclosure, the first metal layer of the first middle ring structure 6081 is not connected to the second metal layer. The first metal layer of the first middle ring structure is a bottom metal layer of the plurality of metal layers of the first middle ring structure. The second metal layer of the first middle ring structure is a sub-bottom metal layer of the plurality of metal layers of the first middle ring structure or a bottom metal layer different from the first metal layer.

At S5023, a second dielectric layer is formed on the second surface of the substrate.

Herein, the second dielectric layer may be the silicon oxide layer or other material layer. In the embodiments of the disclosure, the first dielectric layer is the same as or different from the second dielectric layer.

Figure 6D:
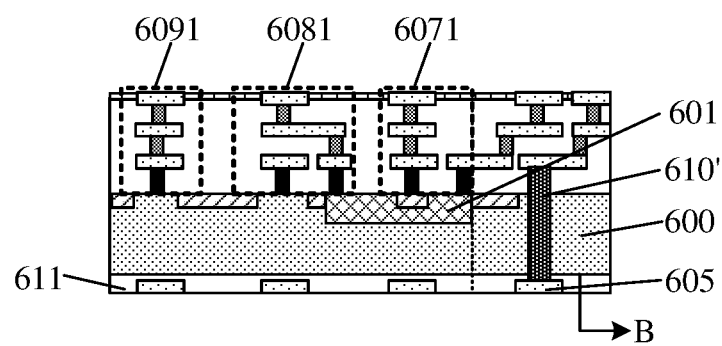

As shown in FIG. 6D, the second dielectric layer 611 is formed on the second surface B of the substrate 600.

In some embodiments, before the second dielectric layer 611 is formed, the method for manufacturing a sealing ring further includes the following operations.

A thinning treatment is performed on the second surface of the substrate, until the silicon blind via structure with a preset height is exposed to form the silicon via. The test circuit is connected to a surface of the topmost chip in the stacked structure through the silicon via.

Continuously referring to FIG. 6D, it can be seen that, the second surface B of the substrate 600 is thinned, to form the silicon via 610'. When the chips are subsequently stacked, the test circuit is connected to the surface of the topmost chip in the stacked structure through the silicon via. In the embodiments of the disclosure, the second surface of the substrate may be thinned through processes such as Chemical Mechanical Polishing (CMP), or etching.

At S5024, a second inner ring structure, a second middle ring structure, and a second outer ring structure are formed in the second dielectric layer.

In some embodiments, S5024 may include the following operations.

The second dielectric layer is etched to form a plurality of second etching holes.

Herein, the second dielectric layer may be etched through dry etching, for example, a plasma etching, reactive ion etching, or ion milling, to form the second etching holes.

Each second etching hole is filled with a second metal material to respectively form the first metal layer of the second inner ring structure, the second middle ring structure, and the second outer ring structure.

The second metal material may be any metal material, such as tungsten or copper. In the embodiments of the disclosure, the first metal material may be the same as or different from the second metal material.

Continuously referring to FIG. 6D, it can be seen that, the first metal layer 605 is formed in the second dielectric layer 611.

At least one second metal layer and a via connecting the first metal layer and the second metal layer are formed on a surface of the first metal layer.

Figure 6E:
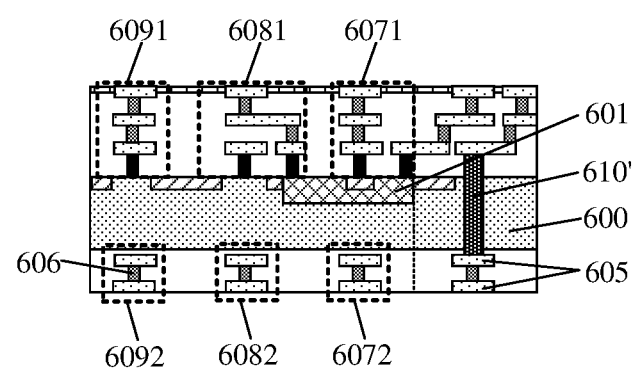

As shown in FIG. 6E, the second metal layer 605 and the via 606 connecting the first metal layer and the second metal layer are formed on the surface of the first metal layer 605, so that the second inner ring structure 6072, the second middle ring structure 6082, and the second outer ring structure 6092 are formed.

According to the sealing ring structure provided in the embodiments of the disclosure, there are sealing ring structures on both sides of the chip. In this way, the strength of a bonding layer is strengthened during chip stacking, so that the protection of the chips can be achieved. In addition, the middle ring structure and the test circuit are arranged in the sealing ring structure, so that the bonding performance of the bonding layer at a sealing ring area can be detected in real time, to timely find failure phenomenon.

Similar to the sealing ring in the above embodiments, regarding the method for manufacturing a sealing ring provided in the embodiments of the disclosure, technical features that are not disclosed in detail in the embodiments of the disclosure can refer to the above embodiments for understanding, which are not described herein again.

According to the method for manufacturing a sealing ring, while forming the inner ring structure and the outer ring structure, the middle ring structure located between the inner ring structure and the outer ring structure and the test circuit located in the device area are also formed. By extracting the middle ring structure and the test circuit through the doped well, the integrity of the sealing ring may be detected. In addition, the existence of the middle ring structure may further enhance the strength of the chips, so that the reliability for protecting devices inside the chips can be achieved. Therefore, the sealing ring structure with high performance is manufactured without increasing process complexity.

In several embodiments provided by the disclosure, it is to be understood that the disclosed device and method may be implemented in non-targeted ways. The device embodiment described above is only schematic. For example, division of the units is only logic function division, and other division manners may be adopted during practical implementation. For example, a plurality of units or components may be combined or integrated into another system, or some characteristics may be omitted or not executed. In addition, the components shown or discussed are coupled to each other, or directly coupled.

The units described as separate parts may or may not be physically separated, and parts displayed as units may or may not be physical units, and namely may be located in the same place, or may also be distributed to multiple network units. Part of all of the units may be selected according to a practical requirement to achieve the purposes of the solutions of the embodiments.

The characteristics disclosed in several method or device embodiments provided in the disclosure can be combined arbitrarily without conflict to obtain a new method embodiment or device embodiment.

The above descriptions are only some implementation modes of the disclosure, but the scope of protection of the embodiments of the disclosure is not limited thereto. Any variation or replacement readily figured out by a person skilled in the art within the technical scope disclosed in the disclosure shall fall within the scope of protection of the disclosure. Therefore, the scope of protection of the embodiments of the disclosure shall be subject to the scope of protection of the claims.

INDUSTRIAL APPLICABILITY

Embodiments of the disclosure provide the sealing ring, the stacked structure, and the method for manufacturing a sealing ring. The sealing ring includes the inner ring structure, the middle ring structure, and the outer ring structure. The middle ring structure is connected to the device area through the doped well. The doped well is located in part of substrate corresponding to the inner ring structure and the middle ring structure, and is isolated from the inner ring structure. Since the sealing ring includes the middle ring structure, chip strength may be further enhanced, so that the reliability for protecting the devices inside the chip may be achieved. In addition, since the middle ring structure can be connected to the device area through the doped well, the integrity of the sealing ring may be detected by designing a specific test circuit at the device area.

The invention claimed is:

1. A sealing ring, arranged at a periphery of a device area of a chip, wherein the sealing ring comprises an inner ring structure, a middle ring structure, and an outer ring structure;
   wherein the middle ring structure is connected to the device area through a doped well; and the doped well is located in part of a substrate corresponding to the inner ring structure and the middle ring structure, and is isolated from the inner ring structure;
   wherein the substrate comprises a first surface and a second surface that are opposite to each other; the doped well is located in the first surface; and the middle ring structure comprises a first middle ring structure and a second middle ring structure;
   wherein the first middle ring structure is arranged in a first dielectric layer on the first surface of the substrate, and the second middle ring structure is arranged in a second dielectric layer on the second surface of the substrate;
   wherein the first middle ring structure comprises a plurality of metal layers, a via connecting the metal layer, and a metal plug connecting the substrate and the metal layer;
   wherein the first surface of the substrate further comprises a plurality of isolation areas and active areas that are arranged at intervals; and
   the metal plug of the first middle ring structure comprises a first metal plug and a second metal plug, wherein the first metal plug is configured to connect one of the active areas and a first metal layer of the plurality of metal layers, and the second metal plug is configured to connect the doped well and a second metal layer of the plurality of metal layers.

2. The sealing ring of claim 1, wherein the device area is provided with a test circuit; and
   the middle ring structure is electrically connected to the test circuit through the doped well.

3. The sealing ring of claim 2, wherein the sealing ring is arranged in a stacked structure, and the stacked structure comprises at least a first chip and a second chip that are stacked in sequence;
   the first middle ring structure of the second chip is electrically connected to the test circuit through the doped well.

4. The sealing ring of claim 3, wherein the device area is further provided with a silicon via; and
   the test circuit is connected to a surface of a topmost chip in the stacked structure through the silicon via.

5. The sealing ring of claim 3, wherein the second middle ring structure of the first chip is connected to the first middle ring structure of the second chip.

6. The sealing ring of claim 1, wherein
   the first metal layer of the first middle ring structure is not connected to the second metal layer of the first middle ring structure.

7. The sealing ring of claim 6, wherein the inner ring structure comprises a first inner ring structure arranged in the first dielectric layer and a second inner ring structure arranged in the second dielectric layer; and
the outer ring structure comprises a first outer ring structure arranged in the first dielectric layer and a second outer ring structure arranged in the second dielectric layer.

8. The sealing ring of claim 7, wherein the first inner ring structure has a same structure as the first outer ring structure; and
   the first inner ring structure comprises a plurality of metal layers, a via connecting the metal layer, and a metal plug connecting the substrate and a third metal layer of the plurality of metal layers.

9. The sealing ring of claim 8, wherein the metal plug of the first inner ring structure is arranged at one of the plurality of isolation areas, and the metal plug of the first outer ring structure is arranged at another one of the active areas.

10. The sealing ring of claim 7, wherein the second inner ring structure, the second middle ring structure, and the second outer ring structure have a same structure; and
    the second inner ring structure comprises at least two metal layers and a via connecting the adjacent metal layers.

11. A stacked structure, comprising a plurality of chips that are bonded back-to-face in sequence, wherein each chip comprises at least the sealing ring of claim 1.

12. A method for manufacturing a sealing ring arranged at a periphery of a device area of a chip, comprising:
    forming a doped well in a substrate of the chip;
    forming an inner ring structure, a middle ring structure, and an outer ring structure around the device area on a surface of the substrate, wherein the sealing ring is formed by the inner ring structure, the middle ring structure, and the outer ring structure; the middle ring structure is connected to the device area through the doped well; and the doped well is located in part of the substrate corresponding to the inner ring structure and the middle ring structure, and is isolated from the inner ring structure;
    forming a plurality of isolation areas and active areas that are arranged at intervals on the first surface of the substrate, before or after the doped well is formed; wherein the doped well is isolated from the inner ring structure through at least one of the plurality of isolation areas;
    wherein the forming the inner ring structure, the middle ring structure, and the outer ring structure around the device area on the surface of the substrate comprises: respectively forming the inner ring structure, the middle ring structure, and the outer ring structure around the device area on a first surface of the substrate and a second surface of the substrate, wherein the first surface is arranged opposite to the second surface, and the doped well is located in the first surface;
    wherein the inner ring structure comprises at least a first inner ring structure located in the first surface of the substrate, the middle ring structure comprises at least a first middle ring structure located in the first surface of the substrate, the outer ring structure comprises at least a first outer ring structure located in the first surface of the substrate;
    wherein the forming the inner ring structure, the middle ring structure, and the outer ring structure on the first surface of the substrate comprises: forming a first dielectric layer on the first surface of the substrate; and forming the first inner ring structure, the first middle ring structure, and the first outer ring structure in the first dielectric layer;

wherein the forming the first inner ring structure, the first middle ring structure, and the first outer ring structure in the first dielectric layer comprises:

etching the first dielectric layer to form a plurality of first etching holes, wherein one first etching hole of the first inner ring structure allows a surface of one of the isolation areas to be exposed, one first etching hole of the first middle ring structure allows a surface of the active areas to be exposed and another first etching hole of the first middle ring structure allows a surface of the doped well to be exposed, and one first etching hole of the first outer ring structure allows a surface of another one of the active areas to be exposed;

filling a first metal material in each first etching hole to form a metal plug; and forming a plurality of metal layers and a via connecting the metal layers on a surface of each metal plug.

13. The method of claim 12, wherein the inner ring structure further comprises a second inner ring structure located in the second surface of the substrate, the middle ring structure further comprises a second middle ring structure located in the second surface of the substrate; the outer ring structure further comprises a second outer ring structure located in the second surface of the substrate;

a second dielectric layer is formed on the second surface of the substrate; and the second inner ring structure, the second middle ring structure, and the second outer ring structure are formed in the second dielectric layer.

14. The method of claim 13, wherein forming the second inner ring structure, the second middle ring structure, and the second outer ring structure in the second dielectric layer comprises:

etching the second dielectric layer to form a plurality of second etching holes;

filling a second metal material in each second etching hole to respectively form the first metal layer of the second inner ring structure, the second middle ring structure, and the second outer ring structure; and forming at least one second metal layer and a via connecting the first metal layer and the second metal layer on a surface of the first metal layer.

15. The method of claim 12, further comprising:

forming a test circuit in the first dielectric layer on a surface of the device area, wherein the first middle ring structure is electrically connected to the test circuit through the doped well.

16. The method of claim 15, wherein the sealing ring is arranged in a stacked structure comprising a plurality of chips that are stacked in sequence, the method further comprising: forming a silicon via structure at the device area;

wherein the test circuit is connected to a surface of a topmost chip in the stacked structure through the silicon via.

* * * * *